(12) United States Patent
Suzuki et al.

(10) Patent No.: US 8,548,416 B2
(45) Date of Patent: Oct. 1, 2013

(54) SEMICONDUCTOR CHIP AND RADIO FREQUENCY CIRCUIT

(75) Inventors: Takuya Suzuki, Tokyo (JP); Kenji Kawakami, Tokyo (JP); Ko Kanaya, Tokyo (JP); Yoichi Kitamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 758 days.

(21) Appl. No.: 12/527,877

(22) PCT Filed: Nov. 15, 2007

(86) PCT No.: PCT/JP2007/072211
§ 371 (c)(1),
(2), (4) Date: Aug. 20, 2009

(87) PCT Pub. No.: WO2008/129713
PCT Pub. Date: Oct. 30, 2008

(65) Prior Publication Data
US 2010/0117711 A1 May 13, 2010

(30) Foreign Application Priority Data
Mar. 30, 2007 (JP) ................... 2007-093472

(51) Int. Cl.
*H04B 1/28* (2006.01)
(52) U.S. Cl.
USPC ........... 455/333; 455/296; 455/302; 455/313; 455/327; 327/356
(58) Field of Classification Search
USPC ....................................... 455/333
See application file for complete search history.

(56) References Cited

U.S. PATENT DOCUMENTS

| 5,140,407 | A  | * | 8/1992 | Kamada | 257/678 |
|---|---|---|---|---|---|
| 6,738,611 | B1 | * | 5/2004 | Politi | 455/302 |
| 6,806,785 | B2 | * | 10/2004 | Traub | 331/108 C |
| 2002/0025794 | A1 | * | 2/2002 | Tamaki et al. | 455/313 |
| 2005/0236689 | A1 |  | 10/2005 | Sugiura et al. |  |
| 2006/0040637 | A1 |  | 2/2006 | Kanaya |  |
| 2006/0109071 | A1 | * | 5/2006 | Thongsouk et al. | 336/200 |

FOREIGN PATENT DOCUMENTS

| EP | 0 495 598 A1 | 7/1992 |
|---|---|---|
| JP | 11 31923 | 2/1999 |
| JP | 11 195730 | 7/1999 |
| JP | 2005 151165 | 6/2005 |

(Continued)

OTHER PUBLICATIONS

Japanese Office Action issued Aug. 9, 2011, in Patent Application No. 2009-510727 (with Partial English-language translation).

(Continued)

*Primary Examiner* — Ajibola Akinyemi
(74) *Attorney, Agent, or Firm* — Oblon, Spivak, McClelland, Maier & Neustadt, L.L.P.

(57) ABSTRACT

A two-terminal semiconductor device is formed on a semiconductor substrate. Two wiring patterns are respectively connected to terminals of the semiconductor device, and two electrode pads are respectively connected to the wiring patterns for connecting a signal input/output circuit formed on a separate substrate. Two parallel wiring patterns are respectively connected to the wiring patterns, and two reactance-circuit connection electrode pads are respectively connected to the parallel wiring patterns for electrically connecting a reactance circuit formed on the separate substrate separately from the signal input/output circuit.

3 Claims, 7 Drawing Sheets

(56) References Cited

FOREIGN PATENT DOCUMENTS

| JP | 2005 311852 | 11/2005 |
|----|-------------|---------|
| JP | 2006-60533 | 3/2006 |
| JP | 2006 222704 | 8/2006 |

OTHER PUBLICATIONS

Wada, Y. et al., "K-band Low Distortion Single Balanced Sub-harmonically Pumped Mixer MMIC", Electronics Society the Institute of Electronics, Information and Communication Engineers, Total 3 pages (Aug. 23, 2002).

M/A-COM Inc. GaAs Flip Chip Schottky Barrier Diodes: internet. http://www.macom.com/DataSheets/MA4E1317_1318_1319.pdf Total 9 pages (Feb. 25, 2006).

Extended European Search Report issued Feb. 14, 2012 in patent application No. 07831941.5.

Khelifa Hettak, et al., "Size Reduction of a MMIC Direct Up-Converter at 44 GHz in Multilayer CPW Technology Using Thin-Film Microstrip Stubs Loading", IEEE Transactions on Microwave Theory and Techniques, vol. 54, No. 9, XP001545221, Sep. 1, 2006, pp. 3453-3461.

Yon-Lin Kok, et al., "A 180-GHz Monolithic Sub-Harmonic InP-Based HEMT Diode Mixer", IEEE Microwave and Guided Wave Letters, vol. 9, No. 12, XP011035511, Dec. 1, 1999, pp. 529-531.

Sanjay Raman, et al., "A High-Performance W-Band Uniplanar Subharmonic Mixer", IEEE Transactions on Microwave Theory and Techniques, vol. 45, No. 6, XP000691120, Jun. 1, 1997, pp. 955-962.

\* cited by examiner

SEMICONDUCTOR CHIP AND RADIO FREQUENCY CIRCUIT

TECHNICAL FIELD

The present invention relates to a semiconductor chip and a radio frequency circuit, and more particularly, to a semiconductor chip and a radio frequency circuit that are suitable for use in a radio frequency wireless communication system or a radar system.

BACKGROUND ART

In recent years, a shift of an operating radio frequency has been getting higher in a wireless communication system. As a matter of fact, the radio frequency band used in an in-vehicle radar system has reached near 100 GHz. A semiconductor circuit used in a system in such a radio frequency band is required to have a necessary radio frequency characteristic, which necessitates an expensive base material such as GsAs and a dedicated process, requiring a considerable manufacturing cost that is proportional to the chip area. For this reason, a development of a discrete circuit has been progressing in which only the semiconductor part that is indispensable for achieving the desired performance is made into a bare chip, and a peripheral signal input/output circuit, a functional circuit, and the like are built on an external substrate made of inexpensive organic resin or ceramic, to reduce the cost of the entire circuit.

In a diode chip used in a conventional discrete circuit, a configuration is mainly used in which a diode device and a connection pad that is the minimum needs to connect each terminal of the diode and a functional circuit on the external substrate are provided, to minimize the chip area (see, for example, Nonpatent Literature 1).

Nonpatent Literature 1: M/A-COM Product Catalog, such as model "MA4E1318", "ONLINE", "Searched on Feb. 25, 2007", Internet <URL:http://www.macom.com/DataSheets/MA4E1317_1318_1319.pdf>

DISCLOSURE OF INVENTION

Problem to be Solved by the Invention

However, in the case of inputting an RF signal and an LO signal to a diode in a mixer circuit in a radio frequency band such as the microwave band and the millimeter-wave band, a radio frequency grounding is required on the signal input side of the diode and an opposite terminal. In the radio frequency band, a parallel stub is generally used as a grounding means for the radio frequency signal because the electrical length of a through hole cannot be ignored. In other words, by parallelly connecting a reactance circuit such as the stub to a connection point of a diode end and each of the input/output strips of the RF/LO signals, an RF/LO short circuit is realized in a standing wave manner.

However, in the case in which the parallel stub is built with a signal input/output circuit on an external substrate to make the above mixer circuit a discrete circuit, because each terminal of the diode has only one connection pad in the diode chip for the conventional discrete circuit, the short circuit characteristics of the RF signal and the LO signal come under the influence of an intervention of a Au-Bump or a wire that is used for connecting the diode chip and the external substrate. In other words, the diode end cannot thoroughly be short-circuited due to an addition of an inductance of the Au-Bump or the wire bond.

Therefore, a mixer circuit that is configured with a diode chip for the conventional discrete circuit cannot make the parallel stub connected to the diode function in an adequate manner, and cannot avoid a conversion loss caused by mounting the Au-Bump, the wire bond, and the like.

The present invention has been achieved in consideration of the above-described aspects, and it is an object of the present invention to provide a semiconductor chip that can make a reactance circuit, which is connected to a semiconductor device on the chip, such as a reflection circuit, a branching circuit, a matching circuit, and the like, function in an adequate manner, and a radio frequency circuit that is constructed using the semiconductor chip.

Means for Solving Problem

A semiconductor chip according to one aspect of the present invention is arranged on a semiconductor substrate on which a two-terminal semiconductor device including a single diode or an anti-parallel diode pair composed of two diodes having opposite polarities connected in parallel is formed and includes two wiring patterns respectively connected to terminals of the two-terminal semiconductor device and two electrode pads respectively connected to the wiring patterns for connecting a signal input/output circuit that is formed on a separate substrate provided separately from the semiconductor substrate. The semiconductor chip further includes two parallel wiring patterns respectively connected to the wiring patterns on terminal ends of the two-terminal semiconductor device; and two reactance-circuit connection electrode pads respectively connected to the parallel wiring patterns for electrically connecting a reactance circuit that is formed on the separate substrate separately from the signal input/output circuit.

Effect of the Invention

According to the present invention, a semiconductor chip includes a parallel wiring pattern and a reactance-circuit connection electrode pad on at least one terminal end of a semiconductor device arranged on a semiconductor substrate. The parallel wiring pattern is connected to a wiring pattern that is provided in advance, and the reactance-circuit connection electrode pad electrically connects a reflection circuit, a branching circuit, a matching circuit, and the like that are provided separately from a signal input/output circuit. Therefore, an effect is achieved that it is possible to make a reactance circuit, such as a reflection circuit, a branching circuit, a matching circuit, and the like that are formed on an external functional circuit formed on a separate substrate outside a discrete circuit, ideally function without being influenced by an inductance of a Au-Bump, a wire, and the like for connecting the semiconductor chip and the external functional circuit.

BRIEF DESCRIPTION OF DRAWINGS

FIG. 5-1 is a circuit diagram showing an ideal equivalent circuit for an RF signal component from the viewpoint of an RF port (RFin) looking at the APDP.

FIG. 5-2 is a circuit diagram showing an ideal equivalent circuit for an LO signal component from the viewpoint of an LO port (LOin) looking at the APDP.

FIG. 7 is a graph showing a reflection characteristic (relative value) from the viewpoint of the APDP end (point A: FIG. 3, point E: FIG. 6) looking at a leading-end open stub side.

FIG. 8 is a smith chart showing the reflection characteristic (relative value) from the viewpoint of the APDP end (point A: FIG. 3, point E: FIG. 6) looking at the leading-end open stub side.

FIG. 3, point E: FIG. 6).

FIG. 3, point E: FIG. 6).

EXPLANATIONS OF LETTERS OR NUMERALS 11, 51 semiconductor device (APDP)
RF-signal input wire pattern
RF-signal input electrode pad
LO-signal input wire pattern
LO-signal input electrode pad
16, 18 parallel wire pattern
17, 19 reactance-circuit connection electrode pad
21, 61, 111, 121 semiconductor chip
22, 62 leading-end open stub
23, 63 leading-end short stub
RF input strip
LO input strip
IF output circuit
AU-Bump
37, 38 inductance
112, 122 FET device
113a, 123a gate terminal electrode pad
113b, 123b source terminal electrode pad
113c, 123c drain terminal first electrode pad
114c, 124c drain terminal second electrode pad
115 resonant circuit
116, 126 output circuit
117 leading-end short circuit
118 reflection circuit (leading-end open stub)
125 input circuit
127 fundamental-wave reflection circuit (leading-end open stub)

BEST MODE(S) FOR CARRYING OUT THE INVENTION

Exemplary embodiments of a semiconductor chip and a radio frequency circuit according to the present invention will be explained in detail below with reference to the accompanying drawings. However, the present invention is not to be considered limited to the embodiments described below.

First Embodiment

Figure 1:
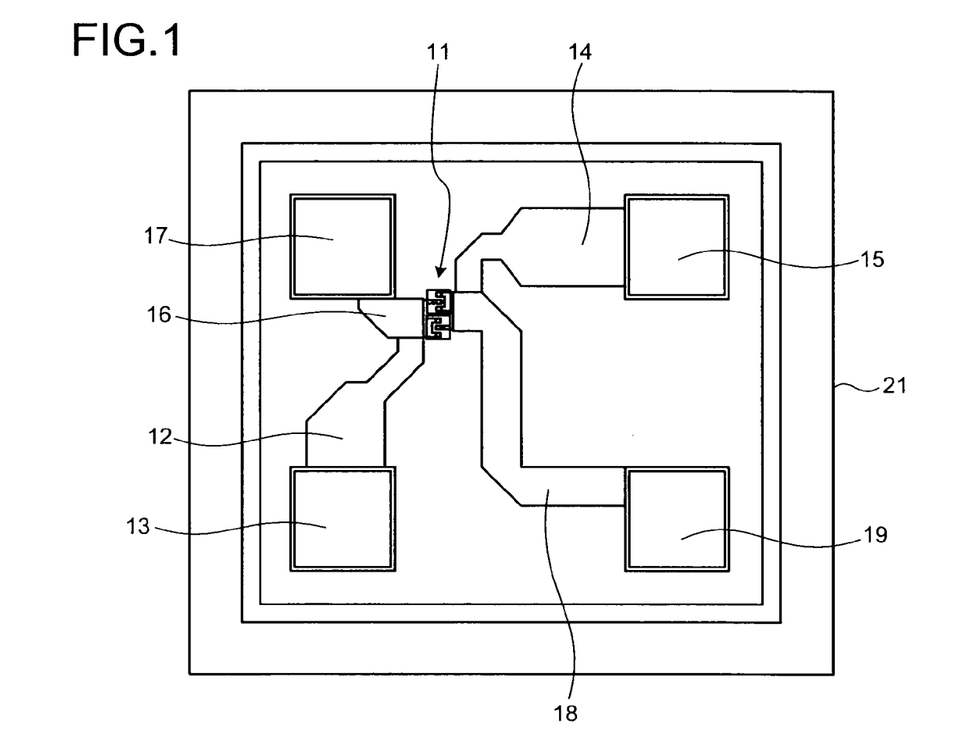
FIG. 1 is a plan view of a semiconductor chip according to a first embodiment of the present invention showing a positional relation in a layout between component parts constituting the semiconductor chip.

FIG. 1 is a plan view of a semiconductor chip 21 according to a first embodiment of the present invention showing a positional relation in a layout between component parts constituting the semiconductor chip. As shown in the figure, various component parts are formed on the semiconductor chip 21, including a semiconductor device 11, a radio frequency signal (hereinafter, referred to as "an RF signal") input wire pattern 12, an RF-signal input electrode pad 13, a local oscillation wave signal (hereinafter, referred to as "an LO signal") input wire pattern 14, an LO-signal input electrode pad 15, a parallel wire pattern 16, a reactance-circuit connection electrode pad 17, a parallel wire pattern 18, and a reactance-circuit connection electrode pad 19. The semiconductor device 11 is, for example, a transistor, a diode, and the like, and at least one device is arranged as the semiconductor device 11.

In the present embodiment, an example case will be explained, in which an anti-parallel diode pair (hereinafter, referred to as "an APDP"), which is composed of two diodes parallelly connected such that the polarities are reversed to each other, is formed on the semiconductor chip, and the semiconductor chip is electrically connected to a function circuit such as a signal input/output circuit, a reflection circuit, and a branching circuit formed on a substrate provided separately from the semiconductor chip, to make up a discrete even harmonic mixer circuit.

In the even harmonic mixer circuit that is made up using the APDP, an LO signal input from an LO-signal input port and an RF signal input from an RF-signal input port are mixed, and generates a signal representing a sum frequency or a difference frequency of the two signals (hereinafter, referred to as "an IF signal"). When the fundamental frequency of the RF signal, and the fundamental frequency of the LO signal, and the frequency of the IF signal are represented by $f_{RF}$, $f_{LO}$ and $f_{IF}$, respectively, a relation of $f_{RF}=|f_{IF}\pm 2 \cdot f_{LO}|$ is established between the frequencies. In addition, the RF signal and the LO signal input to the even harmonic mixer have a relation of $f_{RF} \approx 2 \cdot f_{LO}$.

Referring back to FIG. 1, the RF-signal input wire pattern 12 is a wire pattern functioning as a transmission line for inputting the RF signal to the APDP 11, and its first end is electrically connected to a first end of the APDP 11. The RF-signal input electrode pad 13 is an electrode pad for providing an electric connection point between the RF-signal input wire pattern 12 and a circuit for inputting an RF signal (hereinafter, referred to as "an RF-signal input circuit) formed on a substrate provided separately from the semiconductor substrate, which is not shown in the figure. Similarly, the LO-signal input wire pattern 14 is a wire pattern functioning as a transmission line for inputting the LO signal to the APDP 11, and its first end is electrically connected to a second end of the APDP 11. The LO-signal input electrode pad 15 is an electrode pad for providing an electric connection point between the LO-signal input wire pattern 14 and a circuit for inputting an LO signal (hereinafter, referred to as "an LO-signal input circuit) formed on a substrate provided separately from the semiconductor substrate, which is not shown in the figure. The parallel wire pattern 16 is a wire pattern functioning as a transmission line formed to be branched in parallel with the RF-signal input wire pattern 12, and in the same way as with the RF-signal input wire pattern 12, its first end is electrically connected to the first end of the APDP 11. The reactance-circuit connection electrode pad 17 is an electrode pad for providing an electric connection point between the parallel wire pattern 16 and a function circuit such as a signal input/output circuit, a reflection circuit, and a branching circuit (hereinafter, referred to as "a reactance circuit") formed on a substrate provided separately from the semiconductor substrate, which is not shown. The parallel wire pattern 18 is a wire pattern functioning as a transmission line formed to be branched in parallel with the LO-signal input wire pattern 14, and in the same way as with the LO-signal input wire pattern 14, its first end is electrically connected to the second end of the APDP 11. The reactance-circuit connection electrode pad 19 is an electrode pad for providing an electrical connection point between the parallel wire pattern 18 and a predetermined reactance circuit formed on a substrate provided separately from the semiconductor substrate, which is not shown in the figure.

As described above, the semiconductor chip according to the present embodiment is configured to have the electrode pads for connecting the reactance circuits formed separately from the signal input/output circuit (the reactance-circuit connection electrode pads 17 and 19 in the configuration shown in FIG. 1) in addition to the electrode pads generally provided for inputting and outputting a signal between a signal input/output circuit formed on an external substrate separately provided from the semiconductor chip and each terminal of the semiconductor device (the RF-signal input electrode pad 13 and the LO-signal input electrode pad 15 in the configuration shown in FIG. 1).

Figure 2:
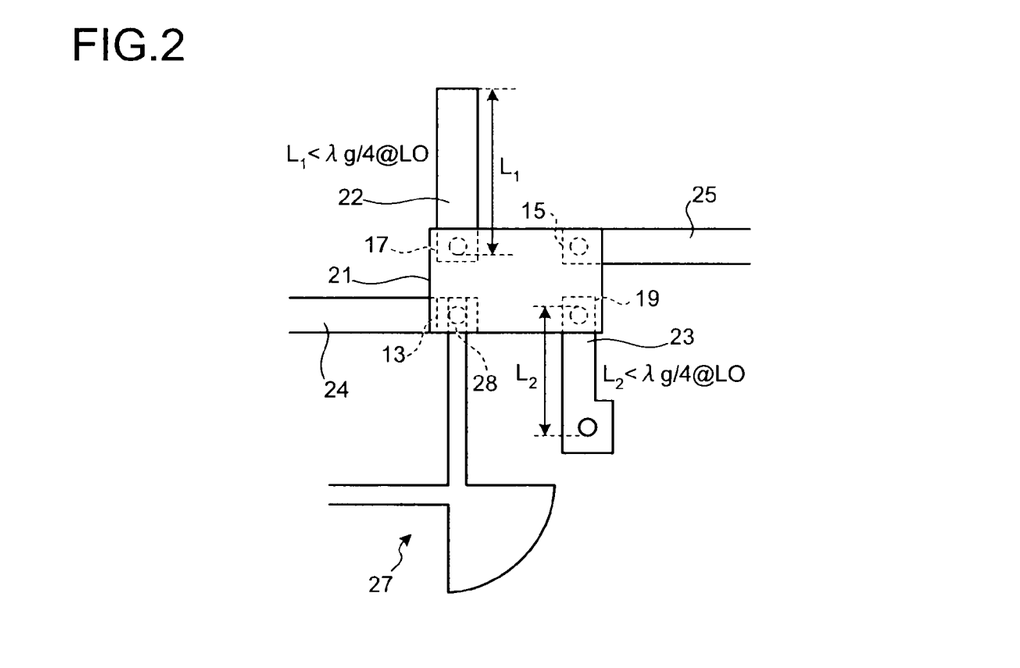
FIG. 2 is a plan view of an even harmonic mixer constructed using the semiconductor chip (APDP) shown in FIG. 1.
Figure 3:
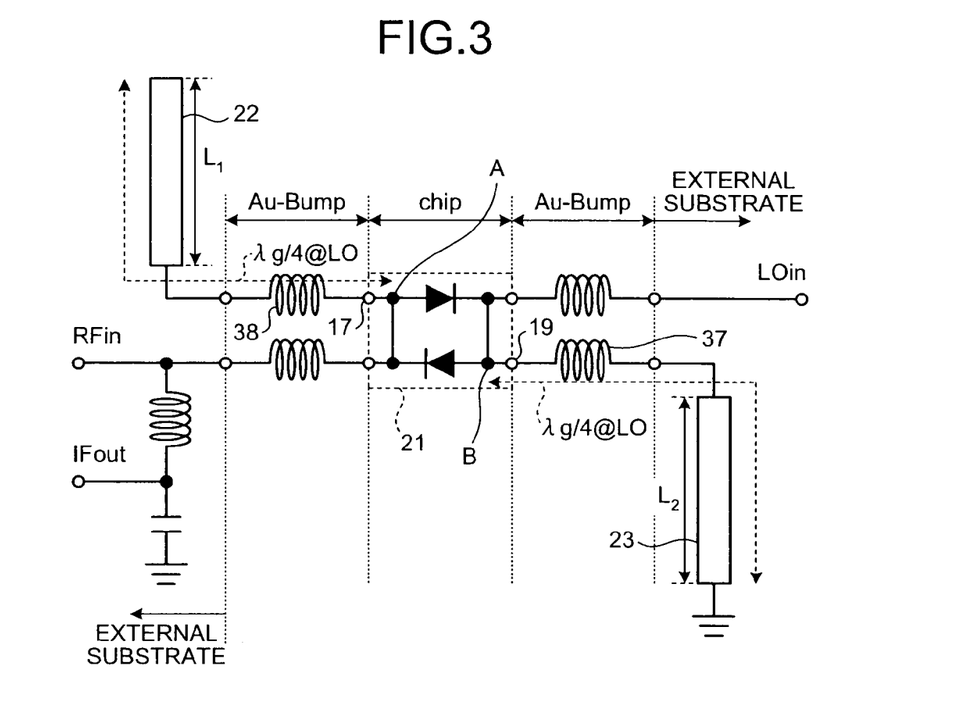
FIG. 3 is a circuit diagram showing an equivalent circuit of the even harmonic mixer shown in FIG. 2.

FIG. 2 is a plan view of a discrete even harmonic mixer constructed by flip-chip mounting the semiconductor chip (APDP) shown in FIG. 1 with a Au-Bump 28 on an external substrate on which signal input/output circuits 24 and 25, branching stubs (reactance circuits) 22 and 23, and an IF output circuit 27 are formed; and FIG. 3 is a circuit diagram showing an equivalent circuit of the even harmonic mixer shown in FIG. 2.

As shown in FIG. 2, the semiconductor chip 21 that is mounted on a predetermined substrate has the above-described four electrode pads (the RF-signal input electrode pad 13, the LO-signal input electrode pad 15, and the reactance-circuit connection electrode pads 17 and 19). An RF input strip 24 is connected to the RF-signal input electrode pad 13, and an LO input strip 25 is connected to the LO-signal input electrode pad 15. A leading-end open stub 22 having a length $L_1$ is connected to the reactance-circuit connection electrode pad 17, and a leading-end short stub 23 having a length $L_2$ is connected to the reactance-circuit connection electrode pad 19.

The leading-end open stub 22 and the leading-end short stub 23 not only have a function of short-circuiting the LO signal and the RF signal at each terminal of the APDP, but also passes signals that are not short circuited in a virtually anti-reflecting manner because the short of the LO signal is the open of the RF signal and the short of the RF signal is the open of the LO signal from the frequency relation ($f_{RF} \approx 2 \cdot f_{LO}$) between the RF signal and the LO signal (for this reason, the two stubs are referred to as "branching stubs" hereinafter).

The IF signal generated by mixing the RF signal and the LO signal by the APDP is extracted from the IF output circuit 27 that is connected to the RF signal input side, with the DC ground of the leading-end short stub 23 that is connected to the LO signal input terminal side as the reference potential. The IF output circuit 27 configures an RF choke that becomes open for the RF frequency at the connection point with the RF input strip 24, such that the only IF signal can be extracted without causing a loss of the RF signal.

Although the IF signal is extracted from the RF side in the present embodiment, the configuration can also be taken in such a manner that the IF signal is extracted from the LO side by arranging a DC grounding means on the RF side and connecting an IF output circuit that becomes open for the LO frequency to the LO side. In this case, because the IF signal becomes also short by the leading-end short stub 23, the configuration can be taken in such a manner that an MIM capacitor or the like is inserted in the parallel wire pattern 18 of the semiconductor chip shown in FIG. 1 such that the DC ground of the leading-end short stub is cut for a DC signal and a low-frequency signal, such as the IF signal.

The length $L_1$ of the leading-end open stub 22 is set to be shorter than a quarter of the LO signal effective wavelength ($\lambda g$), and at the same time, the length $L_2$ of the leading-end short stub 23 is set to be shorter than a quarter of the LO signal effective wavelength ($\lambda g$), too. In FIG. 2, this description is represented as $L_1 < \lambda g/4 @ LO$ and $L_2 < \lambda g/4 @ LO$ (hereinafter, the same expressions are used).

Next, the reason why the length $L_1$ of the leading-end open stub 22 set as $L_1 < \lambda g/4 @ LO$ will be explained.

As indicated by the equivalent circuit shown in FIG. 3, when the leading-end open stub 22 is connected to the reactance-circuit connection electrode pad 17, an inductance 38 of the Au-Bump is added. The Au-Bump has an inductance that cannot be ignored particularly in the millimeter-wave band and the microwave band. For this reason, the length $L_1$ of the leading-end open stub 22 is set to be shorter, such that the electrical length including the inductance 38 of the Au-Bump (hereinafter, referred to as "an equivalent electrical length) becomes $\lambda g/4 @ LO$.

As shown in FIG. 3, it is ideal that the short point, which is determined by the equivalent electrical length taking the inductance 38 of the Au-Bump into consideration, is not the reactance-circuit connection electrode pad 17, but the connection end of the diode that constructs the semiconductor chip 21 (a point A=corresponding to the connection point of the RF-signal input wire pattern 12 and the parallel wire pattern 16 shown in FIG. 1). Therefore, it is preferable that the length $L_1$ of the leading-end open stub 22 should be set by further taking the lengths of the parallel wire pattern 16 and the reactance-circuit connection electrode pad 17 on the semiconductor chip (see FIG. 1) into consideration such that it is short-circuited at the connection point A.

The above configuration can also be applied to the LO input terminal side. When the leading-end short stub 23 is connected to the reactance-circuit connection electrode pad 19, an inductance 37 of the Au-Bump is added. Therefore, the length $L_2$ of the leading-end short stub 23 is set such that the equivalent electrical length including the inductance 37 of the Au-Bump becomes $\lambda g/4 @ LO$. In the similar manner as the RF input terminal side, it is preferable that the length $L_2$ of the leading-end short stub 23 should be set taking the impedance of the leading-end short stub 23, the inductance 37 of the Au-Bump, and the lengths of the parallel wire pattern 18 and the reactance-circuit connection electrode pad 19 (see, FIG. 1) into consideration, such that the short point becomes the connection end of the diode that constructs the semiconductor chip 21 (an point B=corresponding to the connection point of the LO-signal input wire pattern 14 and the parallel wire pattern 18 shown in FIG. 1).

Figure 4:
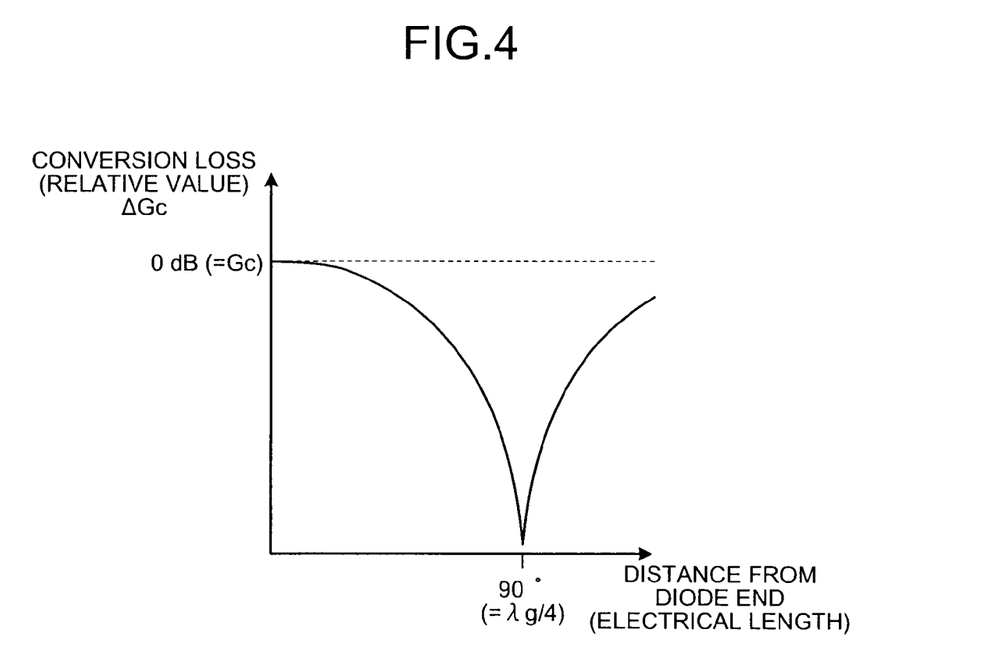
FIG. 4 is a graph showing a relation between a connection point of a branching stub connected to a diode and a conversion loss of the even harmonic mixer.

FIG. 4 is a graph showing a relation between a connection point of a branching stub connected to a diode and a conversion loss of the even harmonic mixer, where the horizontal axis represents the electrical length from the diode end to the connection point of the branching stub on the input/output wire pattern, and the vertical axis represents a relative value of the conversion loss (comparison value with respect to the conversion loss when the branching stub is connected to the diode end). For example, when the length of the branching stub is fixed to length of substantially $\lambda g/4$ such that the branching stub is short-circuited at the LO signal frequency at the connection point, as shown in the figure, the conversion loss of the even harmonic mixer is minimized when the electrical length from the diode end to the connection point of the branching stub is substantially a quarter of the effective wavelength ($=\lambda g/4$). Therefore, as shown in FIG. 3, when the length $L_1$ of the leading-end open stub 22 is set to the length ($L_1 < \lambda g/4@LO$) with which the connection point A of the diode is short-circuited at the LO signal frequency and the length $L_2$ of the leading-end short stub 23 is set to the length ($L_2 < \lambda g/4@LO$) with which the connection point B of the diode is short-circuited at the RF signal frequency, the conversion loss of the even harmonic mixer is minimized.

Setting of the length of the leading-end open stub with which the connection point A of the diode becomes a short end seems to be simply realized even in a semiconductor chip according to the conventional technology, which has a single connection pad at each terminal, by setting the length from the diode end to the connection point of the branching stub to the above length. However, with the configuration of the semiconductor chip according to the conventional technology, the ideal short end cannot be obtained. Its reason will be explained below.

Figure 51:
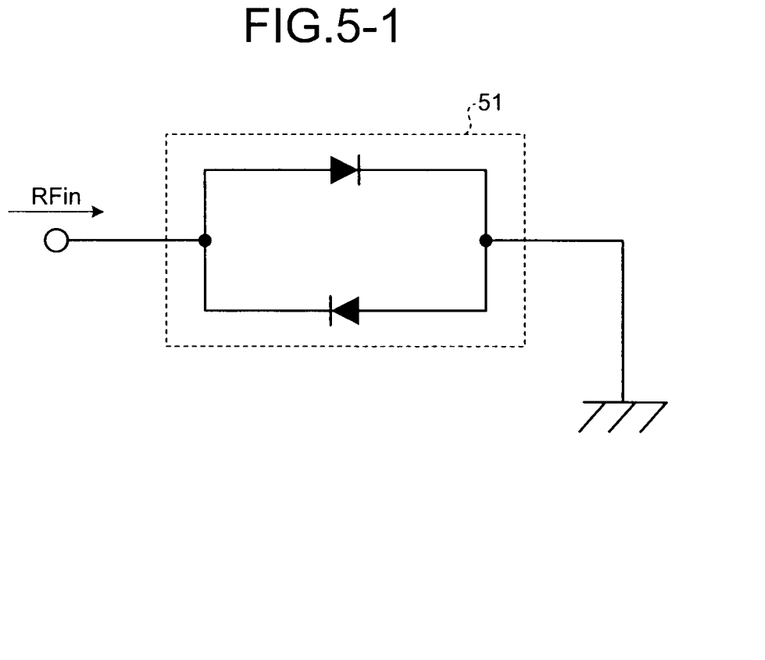
Figure 52:
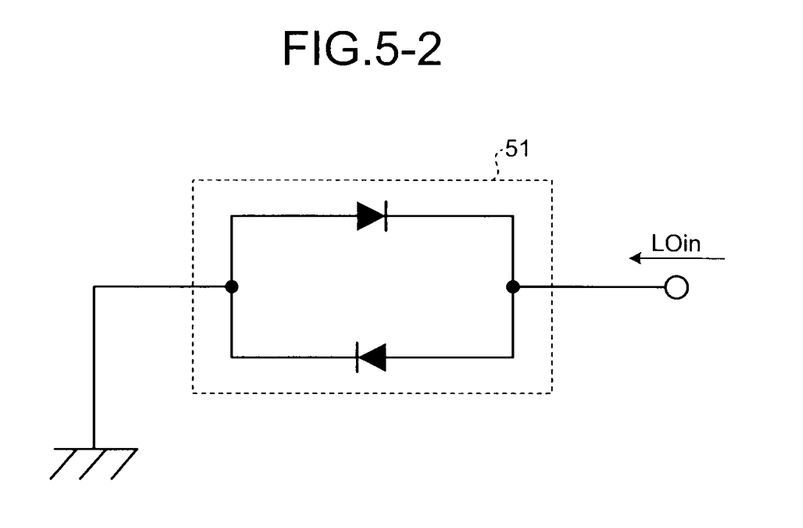

FIG. 5-1 is a circuit diagram showing an ideal equivalent circuit for an RF signal component from the viewpoint of an RF port (RFin) looking at the APDP; and FIG. 5-2 is a circuit diagram showing an ideal equivalent circuit for an LO signal component from the viewpoint of an LO port (LOin) looking at the APDP.

In FIG. 3, when the connection point B is short-circuited ideally at the RF signal frequency (see FIG. 5-1), an RF signal input from an RF port (RFin) is excited at the maximum voltage at both ends of an APDP 51.

Similarly, when the connection point A is short-circuited ideally at the LO signal frequency (see FIG. 5-2), an LO signal input from an LO port (LOin) is excited at the maximum voltage at both ends of the APDP 51. As a result, the APDP performs a frequency mixing of the RF and the LO signals and a frequency conversion with the minimum conversion loss.

Figure 6:
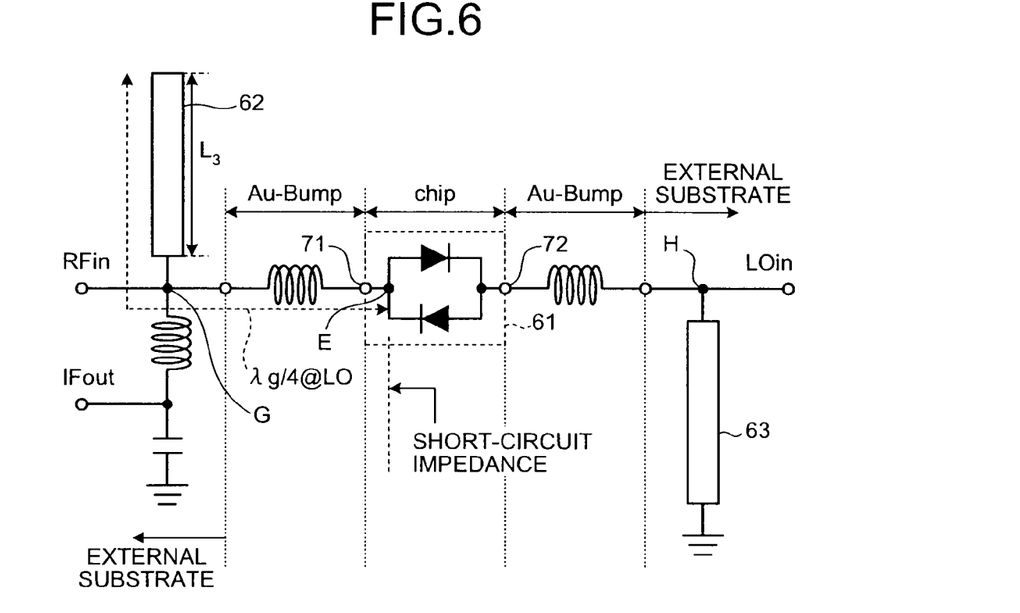
FIG. 6 is a circuit diagram showing an equivalent circuit of an even harmonic mixer constructed using a conventional semiconductor chip (APDP).

FIG. 6 is a circuit diagram showing an equivalent circuit of an even harmonic mixer constructed using a conventional semiconductor chip (APDP). As shown in FIG. 6, the semiconductor chip according to the conventional technology has only single connection pads 71 and 72 at its both ends, respectively. Therefore, as shown in FIG. 6, it is a typical configuration that a leading-end open stub 62 and a leading-end short stub 63 are connected to one end on an RF signal input circuit (a point G) and one end on an LO signal input circuit (a point H) formed on separate substrate from the semiconductor chip, respectively, via a Au-Bump or a wire. In FIG. 6, a length L3 of the leading-end open stub 62 is considered to be set to a length corresponding to the electrical length $\lambda g/4@LO$ including inductances of the Au-Bump and a wire pattern in a semiconductor chip 61.

Figure 7:
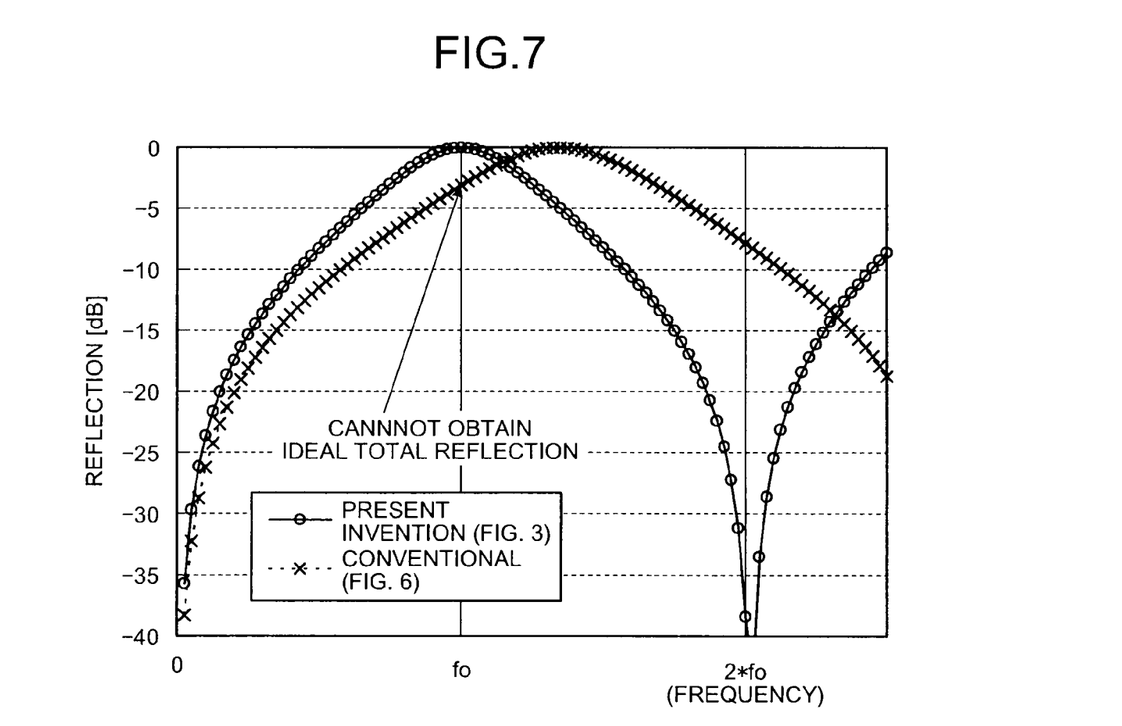
Figure 8:
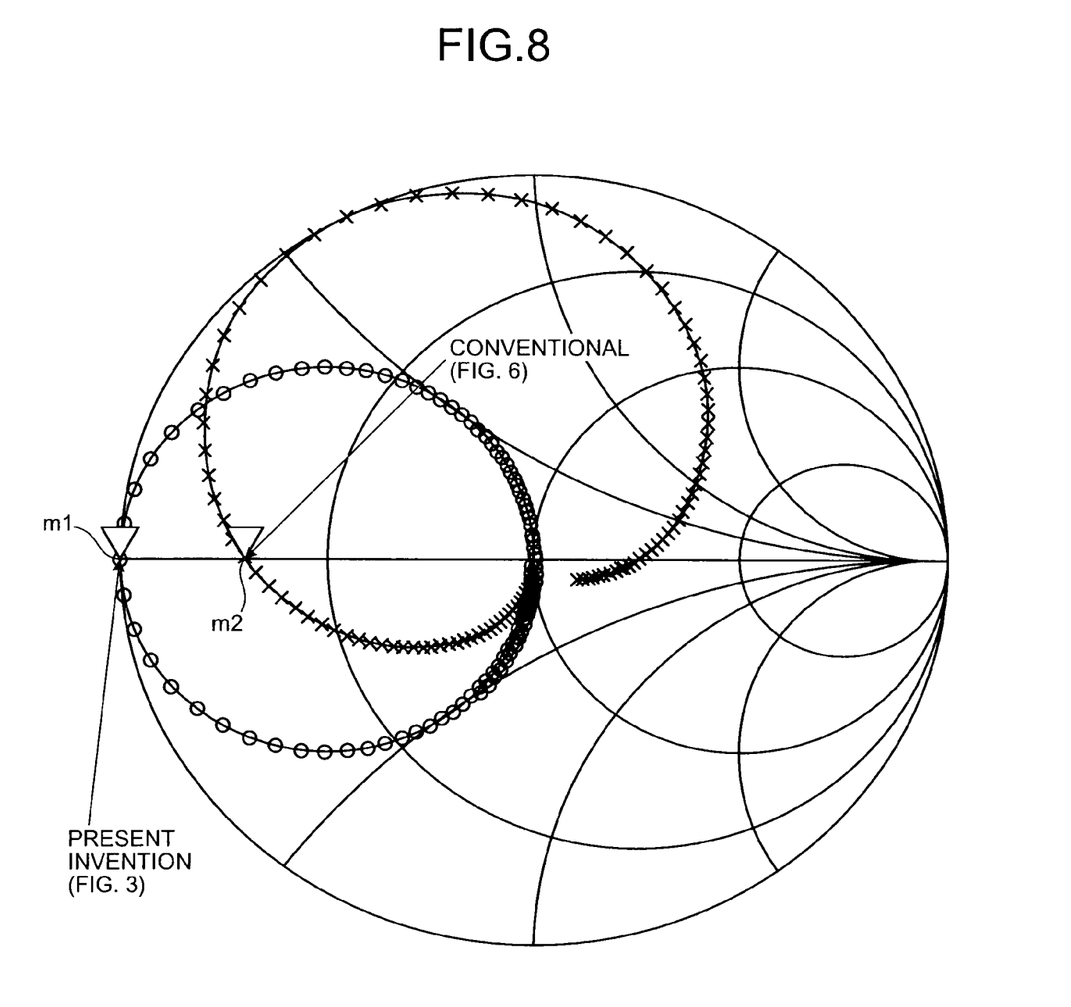
Figure 9:
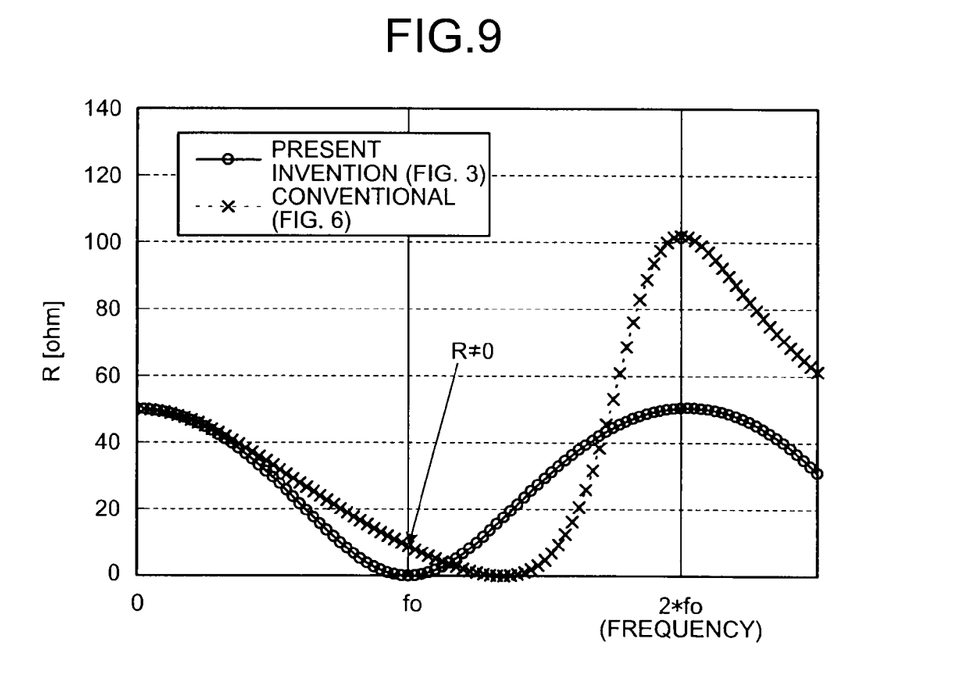
FIG. 9 is a graph showing a short-circuit impedance (real part) at the APDP end (point A.
Figure 10:
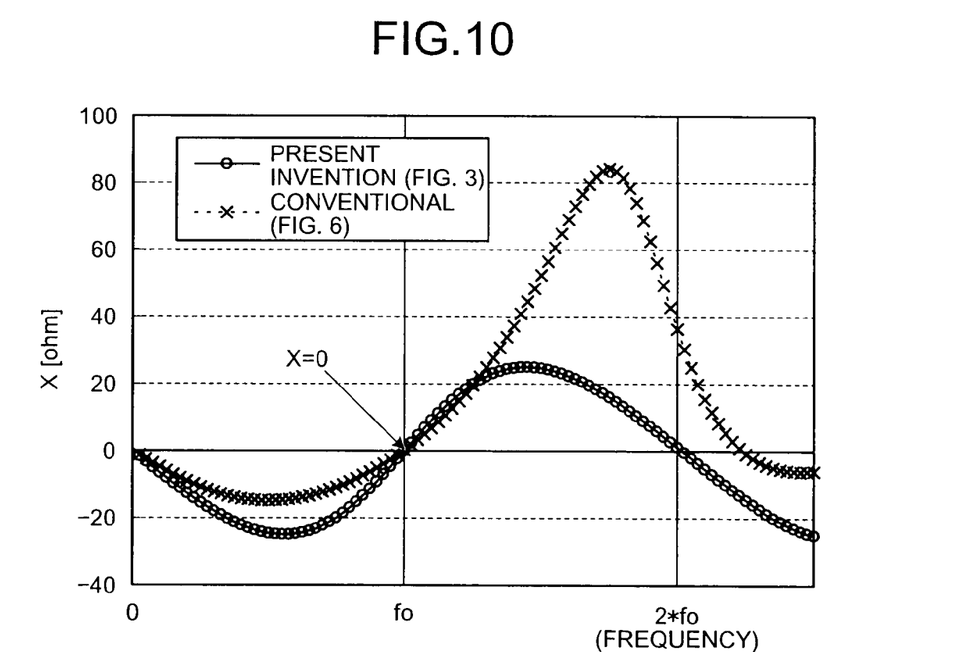
FIG. 10 is a graph showing the short-circuit impedance (imaginary part) at the APDP end (point A.

FIG. 7 is a graph showing a reflection characteristic (relative value) from the viewpoint of the APDP end (point A: FIG. 3, point E: FIG. 6) looking at a leading-end open stub side; FIG. 8 is a smith chart showing the reflection characteristic (relative value) from the viewpoint of the APDP end (point A: FIG. 3, point E: FIG. 6) looking at the leading-end open stub side; FIG. 9 is a graph showing a short-circuit impedance (real part) at the APDP end (point A: FIG. 3, point E: FIG. 6); and FIG. 10 is a graph showing the short-circuit impedance (imaginary part) at the APDP end (point A: FIG. 3, point E: FIG. 6). All the graphs show representative results obtained by a simulation.

In FIGS. 7 to 10, lines drawn with a symbol "o" show the characteristics obtained by using the semiconductor chip according to the present embodiment (see FIG. 3), and lines drawn with a symbol "x" show the characteristics obtained by using the semiconductor chip according to the conventional technology (see FIG. 6). For example, in the case of using the semiconductor chip according to the present invention, the total reflection is realized at an LO frequency $f_0$ (reflection amount=0 dB: see FIG. 7, normalized impedance=0: m1 shown in FIG. 8), and the impedance ($Z=R+jX$) of real part $R=0$ (see FIG. 9) and imaginary part $X=0$ (see FIG. 10) is also realized. In short, it is understood that the point A is an ideal short at the LO frequency.

On the other hand, in the case of using the semiconductor chip according to the conventional technology, reflection amount=−5 dB (see FIG. 7) and normalized impedance≠0 (m2 shown in FIG. 8) at the LO frequency $f_0$, which means that it cannot make an ideal short. In other words, with the configuration shown in FIG. 6 in which the semiconductor chip according to the conventional technology is used, although it is possible to make the imaginary part of the short-circuit impedance zero (see FIG. 10), the real part of the short-circuit impedance cannot made to zero, resulting in some of residual resistance (see FIG. 9). As a result, because the reference potential of the diode cannot be thoroughly grounded, the ideal maximum excitation of the LO signal cannot be obtained, causing an increase of the conversion loss.

As described above, in order to obtain an ideal short-circuit, it is required to connect a branching stub having an electrical length of $\lambda g/4$ from the connection point to a desired point (APDP end) in a parallel manner.

Although an exemplary case is explained in the present invention, in which each of the leading-end and leading-short stubs is connected using a Au-Bump, it is also possible to employ the above configuration even when connecting each of the stub circuits using a wire bond.

As explained above, according to the present embodiment, an ideal RF signal short-circuit and an ideal LO signal short-circuit can be realized on each end of the APDP, and therefore, it is possible to make a branching stub that is connected to the APDP sufficiently function. As a result, the conversion loss of a discrete even harmonic mixer circuit that is configured using the chip can be minimized.

Meanwhile, in order to avoid a degradation of characteristics due to such a mounting, sometimes the conventional radio frequency circuit is configured by integrating a necessary reactance circuit such as a reflection circuit, a branching circuit, a matching circuit, and the like partially on the substrate of the semiconductor device (such as a partial MMIC). On the other hand, in the present embodiment, it is possible to form only the semiconductor (active) device part on the expensive semiconductor substrate by forming an input/output circuit and a reactance circuit such as a reflection circuit, a branching circuit, a matching circuit, and the like other than the semiconductor (active) device on a substrate provided separately from the substrate of the semiconductor device. Therefore, a construction of a discrete circuit is possible with a high degree of freedom in design without having a design constraint due to the mounting, making it possible to expect both the securement of the circuit performance and the downsizing of the semiconductor chip at the same time.

In addition, because the semiconductor chip according to the present embodiment has four electrode pads, a stability can be increased at the time of a flip-chip mounting, compared with the conventional semiconductor chip that has two electrode pads, which makes it possible to reduce an occurrence probability of a so-called chip displacement.

Second Embodiment

Figure 11:
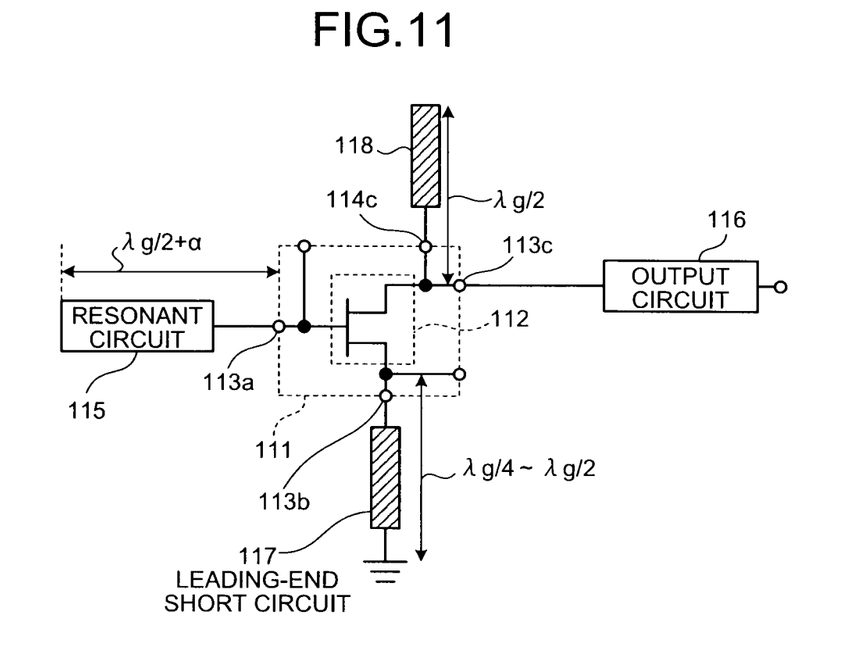
FIG. 11 is a circuit diagram showing an embodiment when an oscillator is constructed using the semiconductor chip shown in the first embodiment.

FIG. 11 is a circuit diagram showing an embodiment when an oscillator is constructed using the semiconductor chip shown in the first embodiment. The oscillator shown in the figure includes a semiconductor chip 111, a resonant circuit 115, an output circuit 116, a leading-end short circuit 117, and a reflection circuit (leading-end open stub) 118.

A field effect transistor (FET device) 112 that is a representative of a three-terminal device is formed in the semiconductor chip 111. Furthermore, four electrode pads including a gate-terminal electrode pad 113a, a source-terminal electrode pad 113b, a drain-terminal first electrode pad 113c, and a drain-terminal second electrode pad 114c are formed in the semiconductor chip 111. Among the electrode pads, the resonant circuit 115 that functions as a resonator is connected to the gate-terminal electrode pad 113a, the leading-end short circuit (source inductor) 117 having an electrical length of $\lambda_g/4$ to $\lambda_g/2$ (where $\lambda_g$ is the effective wavelength of the oscillator output signal) to a source terminal of the FET device 112 is connected to the source-terminal electrode pad 113b, the output circuit 116 for extracting the oscillation output is connected to the drain-terminal first electrode pad 113c, and the leading-end open stub 118 having an electrical length of $\lambda_g/4$ to a drain terminal of the FET device 112 is connected to the drain-terminal second electrode pad 114c. The leading-end open stub 118 functions as a reflection circuit for increasing a reflection gain at a signal frequency by a negative feedback of the output signal of the FET device 112. The resonant circuit 115 connected to the gate-terminal electrode pad 113a is constructed of a resonator that operates in an oscillation frequency band and a phase line having a predetermined electrical length to a base terminal of the FET device 112 that applies a phase condition for determining an oscillation frequency. For example, it is possible to implement a function of the resonator by taking a configuration as a stub having an electrical length given by a length of the resonator ($\lambda_g/2$) and a length of the phase line ($\alpha$). Although a power supply circuit for supplying an operation voltage to the FET device 112 is included in the resonant circuit 115 and the output circuit 116, it is not shown in the figure and an explanation therefore is omitted.

As an operation signal frequency increases, it is required to connect the reflection circuit 118 to the drain terminal of the FET device 112 in a proximal manner. For example, when a configuration is taken with the output circuit by connecting only the drain-terminal first electrode pad 113c, the upper-limit frequency with which the reflection gain is obtained is decreased due to the inductance of a Au-Bump, a wire, and the like. For this reason, the reflection circuit 118 is required to be connected closer to the drain terminal side than the connection point of the Au-Bump, the wire, and the like.

According to the present embodiment, when obtaining a reflection gain necessary for an oscillation operation, for example, it is possible to obtain a desired characteristic without being affected by a constraint of the upper-limit frequency due to an addition of the inductance of the Au-Bump, the wire, and the like, which makes it possible to expect a high-frequency oscillation operation. In the past, sometimes the reflection circuit 118 is formed on the semiconductor substrate on which the FET device 112 is formed (partial integration) to obtain the desired characteristic; however, such a design method is not necessary, and only the FET device 112 can be formed on the expensive semiconductor device substrate. Therefore, a construction of a discrete circuit is possible with a high degree of freedom in design without having a design constraint due to the mounting, making it possible to expect both the securement of the circuit performance and the downsizing of the semiconductor chip at the same time.

Although two electrode pads are arranged on the drain terminal of the transistor that constructs the semiconductor chip in the present embodiment, the configuration is not limited to this scheme. For example, two electrode pads can also be arranged on either one of the gate terminal and the source terminal according to the needs of the circuit.

Third Embodiment

Figure 12:
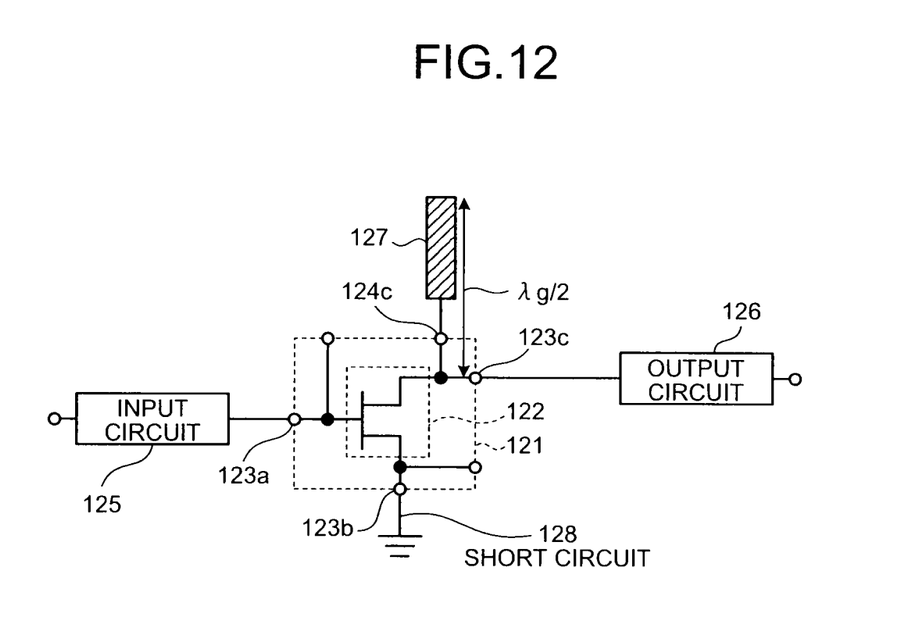
FIG. 12 is a circuit diagram showing an embodiment when a frequency multiplier is constructed using the semiconductor chip shown in the first embodiment.

FIG. 12 is a circuit diagram showing an embodiment when a frequency multiplier (even numbered) is constructed using the semiconductor chip shown in the first embodiment. The frequency multiplier shown in the figure includes a semiconductor chip 121, an input circuit 125, an output circuit 126, a short circuit 128, and a fundamental-wave reflection circuit (leading-end open stub) 127.

A field effect transistor (FET device) 122 that is a representative of a three-terminal device is formed in the semiconductor chip 121. Furthermore, four electrode pads including a gate-terminal electrode pad 123a, a source-terminal electrode pad 123b, a drain-terminal first electrode pad 123c, and a drain-terminal second electrode pad 124c are formed in the semiconductor chip 111. Among the electrode pads, the input circuit 125 that functions as a matching circuit for a fundamental wave of an input signal is connected to the gate-terminal electrode pad 123a, the short circuit 128 for grounding a signal of a DC and a high-frequency band is connected to the source-terminal electrode pad 123b, the output circuit 126 that functions as a matching circuit for an even multiplication signal that is obtained by multiplying a fundamental-wave signal by an even number is connected to the drain-terminal first electrode pad 123c, and the leading-end open stub 127 having an electrical length of $\lambda_g/4$ to a drain terminal of the FET device 122 is connected to the drain-terminal second electrode pad 124c. The leading-end open stub 127 connected to the drain-terminal second electrode pad 124c functions as a total-reflection circuit for the fundamental wave. Although a power supply circuit for supplying an operation voltage to the FET device 122 is included in the input circuit 125 and the output circuit 126, it is not shown in the figure and an explanation therefore is omitted.

Also in the frequency multiplier (even numbered) according to the present embodiment, when forming a matching circuit for a fundamental-wave total reflection and an even multiplication signal, a circuit design is possible with a high degree of freedom in design without having a constraint due to an addition of the inductance of the Au-Bump, the wire, and the like. As a result, it is possible to construct a discrete-type (even-numbered) frequency multiplier obtaining a desired characteristic.

Although two electrode pads are arranged on the drain terminal of the transistor that constructs the semiconductor chip in the present embodiment, the configuration is not limited to this scheme. For example, two electrode pads can also be arranged on either one of the gate terminal and the source terminal according to the needs of the circuit.

In the first to the third embodiment, for example, explanation is given about an example of a case in which a semiconductor device is formed with the APDP as a two-terminal device and the FET as a three-terminal device. However, the semiconductor device is not limited to those two-terminal device and the three-terminal device. For example, it is possible to use a single function device such as a bipolar transistor and an IGBT and a series tee that is constructed by connecting two diodes of the same polarity in a serial manner as the three-terminal device. Moreover, for example, it is also possible to use a four-terminal device such as a ring quad that is constructed by connecting four devices of a single diode or the APDP in a ring shape.

INDUSTRIAL APPLICABILITY

As described above, the radio frequency circuit and the semiconductor chip according to the present invention is effective as an invention that can make a reflection circuit, a branching circuit, a matching circuit, and the like that are connected to a semiconductor device on the chip function in an adequate manner.

The invention claimed is:

1. A semiconductor chip which is formed by a semiconductor substrate on which there are provided a two-terminal semiconductor device including a single diode or an anti-parallel diode pair composed of two diodes having opposite polarities connected in parallel, two wiring patterns that are respectively connected to terminals of the two-terminal semiconductor device and formed on a first-terminal side and a second-terminal side of the two-terminal semiconductor device, and two electrode pads respectively connected to the wiring patterns for connecting a signal input/output circuit that is formed on a different substrate provided separately from the semiconductor chip, wherein the semiconductor chip further comprises:
   two parallel wiring patterns that are respectively connected to the wiring patterns on terminal ends of the two-terminal semiconductor device and formed on a first-terminal side and a second-terminal side of the two-terminal semiconductor device; and
   two reactance-circuit connection electrode pads respectively connected to the parallel wiring patterns for respectively electrically connecting reactance circuits that are formed on the different substrate separately from the signal input/output circuit, wherein
   a length of a local-oscillator branching stub is set to a length with which a local-oscillator signal is short-circuited at a first terminal of the anti-parallel diode pair, and
   a length of a radio-frequency branching stub is set to a length with which a radio-frequency signal is short circuited at a second terminal of the anti-parallel diode pair.

2. A radio frequency circuit comprising:
   a semiconductor chip which is formed by a semiconductor substrate on which there are provided an anti-parallel diode pair composed of two diodes having opposite polarities connected in parallel, two wiring patterns that are respectively connected to terminals of the anti-parallel diode pair and formed on a first-terminal side and a second-terminal side of the anti-parallel diode pair, and two electrode pads respectively connected to the wiring patterns; and
   a signal input/output circuit that is formed on a separate substrate provided separately from the semiconductor chip, is electrically connected to the electrode pads, and includes a local-oscillator signal input circuit that inputs a local-oscillator signal to the anti-parallel diode pair, a radio-frequency signal input/output circuit that inputs and outputs a radio frequency signal with respect to the anti-parallel diode pair, and an intermediate-frequency signal input/output circuit that branches and inputs and outputs an intermediate-frequency signal generated from the local-oscillator signal and the radio-frequency signal, wherein
   the semiconductor chip includes
      two parallel wiring patterns including a first parallel wiring pattern and a second parallel wiring pattern formed on a first terminal side and a second terminal side of the anti-parallel diode pair, respectively connected to the wiring patterns on terminal ends of the anti-parallel diode pair, and
      two reactance-circuit connection electrode pads including a first reactance-circuit connection electrode pad and a second reactance-circuit connection electrode pad connected to the first parallel wiring pattern and the second parallel wiring pattern, respectively, for respectively electrically connecting reactance circuits that are formed on the separate substrate separately from the signal input/output circuit,
   the reactance circuit includes
      a local-oscillator branching stub that is connected to the first reactance-circuit connection electrode pad and enables a passage of the radio-frequency signal at the first terminal of the anti-parallel diode pair while short-circuiting the local-oscillator signal, and
      a radio-frequency branching stub that is connected to the second reactance-circuit connection electrode pad and enables a passage of the local-oscillator signal at the second terminal of the anti-parallel diode pair while short-circuiting the radio-frequency signal, and
   with the above configuration, the radio frequency circuit functions as an even harmonic mixer.

3. The radio frequency circuit according to claim 2, wherein
   a length of the local-oscillator branching stub is set to a length with which the local-oscillator signal is short-circuited at the first terminal of the anti-parallel diode pair, and
   a length of the radio-frequency branching stub is set to a length with which the radio-frequency signal is short circuited at the second terminal of the anti-parallel diode pair.

* * * * *